_(12)_ United States Patent
Choi

(10) Patent No.: US 12,232,381 B2
(45) Date of Patent: Feb. 18, 2025

(54) DISPLAY PANEL

(71) Applicant: LG Display Co., Ltd., Seoul (KR)

(72) Inventor: Jaeyi Choi, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/490,506

(22) Filed: Oct. 19, 2023

(65) Prior Publication Data

US 2024/0206258 A1    Jun. 20, 2024

(30) Foreign Application Priority Data

Dec. 14, 2022  (KR) .................. 10-2022-0174943

(51) Int. Cl.
*H10K 59/131*    (2023.01)
*G09G 3/3225*    (2016.01)

(52) U.S. Cl.
CPC ......... *H10K 59/131* (2023.02); *G09G 3/3225* (2013.01); *G09G 2300/0408* (2013.01); *G09G 2300/0426* (2013.01); *G09G 2300/0842* (2013.01); *G09G 2320/02* (2013.01)

(58) Field of Classification Search
CPC .... H10K 59/131; H10K 59/40; H10K 59/124; G09G 3/3225; G09G 2300/0408; G09G 2300/0426; G09G 2300/0842; G09G 2320/02; G09G 3/3266; G09G 3/3208; G09G 3/3233
See application file for complete search history.

(56) References Cited

U.S. PATENT DOCUMENTS

| | | | |
|---|---|---|---|
| 11,049,436 B1 | 6/2021 | Shin et al. | |
| 11,532,691 B2 | 12/2022 | Lee et al. | |
| 2008/0136756 A1 | 6/2008 | Yeo et al. | |
| 2011/0267283 A1 | 11/2011 | Chang et al. | |
| 2017/0200420 A1 | 7/2017 | No et al. | |
| 2021/0335166 A1 | 10/2021 | Choi et al. | |
| 2022/0059039 A1 | 2/2022 | Roh et al. | |
| 2022/0236825 A1* | 7/2022 | Lee ...................... H10K 59/873 |

FOREIGN PATENT DOCUMENTS

| | | |
|---|---|---|
| CN | 113554992 A | 10/2021 |
| JP | 2019144386 A | 8/2019 |
| KR | 10-2013-0050564 A | 5/2013 |
| KR | 10-2021-0068814 A | 6/2021 |
| KR | 10-2022-0059939 A | 5/2022 |
| TW | 202133139 A | 9/2021 |
| WO | WO 2011065045 A1 | 6/2011 |
| WO | WO 2014054515 A1 | 4/2014 |

* cited by examiner

*Primary Examiner* — Koosha Sharifi-Tafreshi
(74) *Attorney, Agent, or Firm* — Seed IP Law Group LLP

(57) ABSTRACT

A display panel according to embodiments of the disclosure may comprise a substrate in which a display area and a non-display area are divided, a gate driving circuit disposed on the substrate and disposed in a gate driving circuit area within the non-display area, a plurality of gate clock lines disposed on the substrate and disposed in a first line area positioned outside the gate driving circuit area in the non-display area, an overcoat layer disposed on the plurality of gate clock lines and the gate driving circuit, a cathode electrode disposed in the display area and extending to the non-display area, and a load deviation compensation pattern overlapping the plurality of gate clock lines.

18 Claims, 10 Drawing Sheets

DISPLAY PANEL

CROSS-REFERENCE TO RELATED APPLICATION

This application claims priority from Korean Patent Application No. 10-2022-0174943, filed on Dec. 14, 2022, which is hereby incorporated by reference for all purposes as if fully set forth herein.

BACKGROUND

Technical Field

Embodiments of the disclosure relate to a display panel.

Description of Related Art

As the information society develops, demand for display devices for displaying images is increasing in various forms. Various display devices, such as liquid crystal display devices and organic light emitting display devices, are being utilized in recent years.

For image display, a display device may include a display panel where a plurality of data lines and a plurality of gate lines are disposed, a data driving circuit outputting data signals to the plurality of data lines, and a gate driving circuit outputting gate signals to the plurality of gate lines.

In the conventional display field, to reduce the number of components and the bezel size, gate in panel (GIP) technology for embedding gate driving circuits in the display panel has been developed.

BRIEF SUMMARY

The inventors have realized that if gate driving circuits are embedded in the display panel, an unexpected malfunction of the gate driving circuit or an abnormal screen abnormality may occur. Having identified this potential for failure, they disclose herein techniques to reduce or fully eliminate the occurrence of such problems.

Embodiments of the disclosure may provide a display panel reduces or fully prevents a screen abnormality although the gate driving circuit is embedded therein.

Embodiments of the disclosure may provide a display panel that maintains normal operation of the gate driving circuit although the gate driving circuit is embedded therein.

Embodiments of the disclosure may provide a display panel capable of reducing the area of a gate bezel that includes the gate driving circuit.

Embodiments of the disclosure may provide a display panel capable of reducing a load deviation between gate clock lines related to the operation of the gate driving circuit.

A display panel according to embodiments of the disclosure may comprise a substrate having a display area and a non-display area, a gate driving circuit disposed on the substrate and disposed in a gate driving circuit area within the non-display area, a plurality of gate clock lines disposed on the substrate and disposed in a first line area positioned outside the gate driving circuit area in the non-display area, an overcoat layer disposed on the plurality of gate clock lines and the gate driving circuit, a cathode electrode disposed in the display area and extending to the non-display area, and a load deviation compensation pattern overlapping the plurality of gate clock lines. In one embodiment extends as a continuous, integral member from the display area to the non-display area.

In the display panel according to embodiments of the disclosure, the load deviation compensation pattern may be positioned above the plurality of gate clock lines.

In the display panel according to embodiments, the load deviation compensation pattern may include the same material as the anode electrode.

A display panel according to embodiments of the disclosure may comprise a substrate having a display area and a non-display area, a cathode electrode disposed in the display area and extending to the non-display area, a gate driving circuit disposed on the substrate and disposed in a gate driving circuit area within the non-display area, a plurality of gate clock lines disposed on the substrate, disposed in a first line area positioned outside the gate driving circuit area in the non-display area, and disposed to not overlap the cathode electrode, and an overcoat layer disposed on the plurality of gate clock lines and the gate driving circuit.

According to embodiments of the disclosure, there may be provided a display panel that does not causing a screen abnormality although the gate driving circuit is embedded therein.

According to embodiments of the disclosure, there may be provided a display panel capable of normal operation of the gate driving circuit although the gate driving circuit is embedded therein.

According to embodiments of the disclosure, there may be provided a display panel capable of reducing a gate bezel related to embedding the gate driving circuit.

According to embodiments of the disclosure, there may be provided a display panel capable of reducing a load deviation between gate clock lines by disposing gate clock lines related to the operation of the gate driving circuit not to overlap the cathode electrodes.

According to embodiments of the disclosure, there may be provided a display panel capable of reducing a load deviation between gate clock lines by further disposing a load deviation compensation pattern overlapping gate clock lines.

According to the embodiments of the disclosure, there may be provided a display panel capable of reducing a scan signal output characteristic deviation in the gate driving circuit by reducing the load deviation between gate clock lines.

DESCRIPTION OF THE SEVERAL VIEWS OF THE DRAWINGS

The above and other objects, features, and advantages of the disclosure will be more clearly understood from the following detailed description, taken in conjunction with the accompanying drawings, in which.

DETAILED DESCRIPTION

Figure 1:
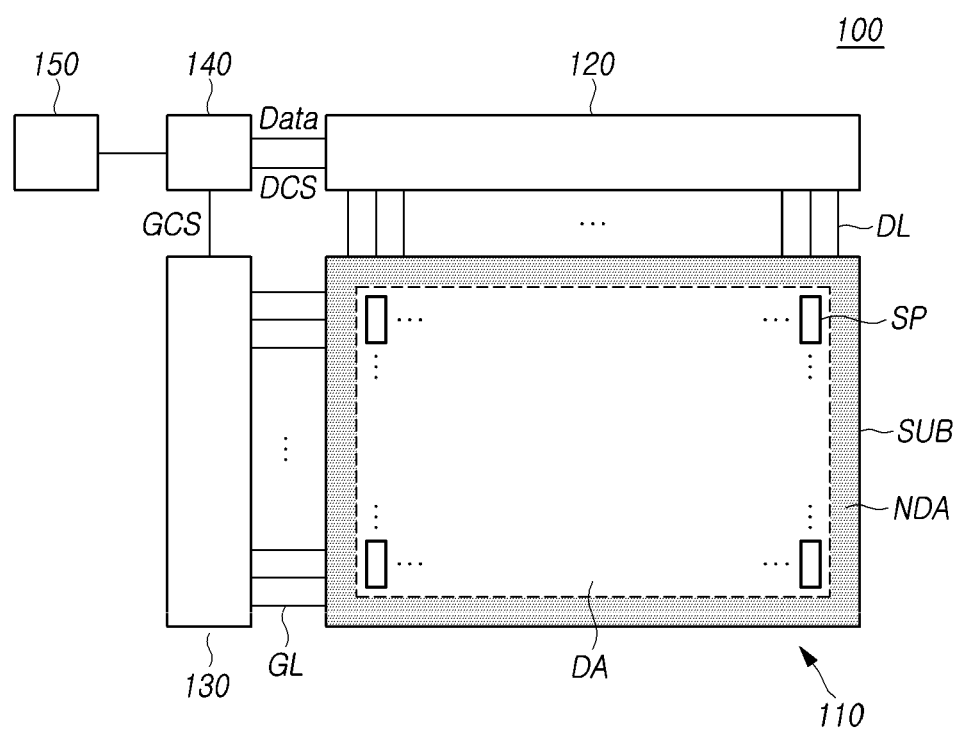
FIG. 1 is a view illustrating a system configuration of a display device according to embodiments of the disclosure.

In the following description of examples or embodiments of the disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the disclosure, detailed descriptions of well-known functions and components incorporated herein will be omitted when it is determined that the description may make the subject matter in some embodiments of the disclosure rather unclear. The terms such as "including", "having", "containing", "constituting" "make up of", and "formed of" used herein are generally intended to allow other components to be added unless the terms are used with the term "only". As used herein, singular forms are intended to include plural forms unless the context clearly indicates otherwise.

The shapes, sizes, dimensions (e.g., length, width, height, thickness, radius, diameter, area, etc.), ratios, angles, number of elements, and the like illustrated in the accompanying drawings for describing the embodiments of the present disclosure are merely examples, and the present disclosure is not limited thereto.

A dimension including size and a thickness of each component illustrated in the drawing are illustrated for convenience of description, and the present disclosure is not limited to the size and the thickness of the component illustrated, but it is to be noted that the relative dimensions including the relative size, location, and thickness of the components illustrated in various drawings submitted herewith are part of the present disclosure.

Terms, such as "first", "second", "A", "B", "A", or "B" may be used herein to describe elements of the disclosure. Each of these terms is not used to define essence, order, sequence, or number of elements, etc., but is used merely to distinguish the corresponding element from other elements.

When it is mentioned that a first element "is connected or coupled to", "contacts or overlaps", etc., a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc., each other via a fourth element. Here, the second element may be included in at least one of two or more elements that "are connected or coupled to", "contact or overlap", etc., each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes, etc., are mentioned, it should be considered that numerical values for an elements or features, or corresponding information (e.g., level, range, etc.) include a tolerance or error range that may be caused by various factors, e.g., process factors, internal or external impact, noise, etc.) even when a relevant description is not specified. Further, the term "may" fully encompasses all the meanings of the term "can".

Hereinafter, various embodiments of the disclosure are described in detail with reference to the accompanying drawings.

FIG. 1 is a view illustrating a configuration of a display device 100 according to embodiments of the disclosure.

Referring to FIG. 1, a display device 100 according to embodiments of the disclosure may include a display panel 110 and driving circuits for driving the display panel 110.

The driving circuits may include a data driving circuit 120 and a gate driving circuit 130. The display device 100 may further include a controller 140 controlling the data driving circuit 120 and the gate driving circuit 130.

The display panel 110 may include a substrate SUB and signal lines, such as a plurality of data lines DL and a plurality of gate lines GL disposed on the substrate SUB. The display panel 110 may include a plurality of subpixels SP connected to the plurality of data lines DL and the plurality of gate lines GL.

The display panel 110 may include a display area DA in which images are displayed and a non-display area NDA in which no image is displayed. In the display panel 110, a plurality of subpixels SP for displaying images may be disposed in the display area DA, and the driving circuits 120, 130, and 140 may be electrically connected or disposed in the non-display area NDA. Further, pad units for connection of integrated circuits or a printed circuit may be disposed in the non-display area NA.

The data driving circuit 120 is a circuit for driving the plurality of data lines DL, and may supply data signals to the plurality of data lines DL. The gate driving circuit 130 is a circuit for driving the plurality of gate lines GL, and may supply gate signals to the plurality of gate lines GL. The controller 140 may supply a data control signal DCS to the data driving circuit 120 to control the operation timing of the data driving circuit 120. The controller 140 may supply a gate control signal GCS for controlling the operation timing of the gate driving circuit 130 to the gate driving circuit 130.

The controller 140 may start scanning according to a timing implemented in each frame, convert input image data input from the outside into image data Data suited for the data signal format used in the data driving circuit 120, supply the image data Data to the data driving circuit 120, and control data driving at an appropriate time suited for scanning.

The controller 140 receives, from the outside (e.g., a host system 150), various timing signals including a vertical synchronization signal VSYNC, a horizontal synchronization signal HSYNC, an input data enable signal DE, and a clock signal, along with the input image data.

To control the data driving circuit 120 and the gate driving circuit 130, the controller 140 receives timing signals, such as the vertical synchronization signal VSYNC, horizontal synchronization signal HSYNC, input data enable signal DE, and clock signal CLK, generates various control signals DCS and GCS, and outputs the control signals to the data driving circuit 120 and the gate driving circuit 130.

As an example, to control the gate driving circuit 130, the controller 140 outputs various gate control signals GCS including a gate start pulse GSP, a gate shift clock GSC, and a gate output enable signal (Gate Output Enable, GOE).

To control the data driving circuit 120, the controller 140 outputs various data control signals DCS including, e.g., a source start pulse SSP, a source sampling clock SSC, and a source output enable signal (Source Output Enable, SOE).

The controller 140 may be implemented as a separate component from the data driving circuit 120, or the controller 140, along with the data driving circuit 120, may be implemented as an integrated circuit.

The data driving circuit 120 receives the image data Data from the controller 140 and supply data voltages to the plurality of data lines DL, thereby driving the plurality of data lines DL. The data driving circuit 120 is also referred to as a "source driving circuit."

The data driving circuit 120 may include one or more source driver integrated circuit (SDICs).

Each source driver integrated circuit (SDIC) may include a shift register, a latch circuit, a digital-to-analog converter (DAC), and an output buffer. In some cases, each source driver integrated circuit (SDIC) may further include an analog-digital converter ADC.

For example, each source driver integrated circuit (SDIC) may be connected with the display panel 110 by a tape automated bonding (TAB) method or connected to a bonding pad of the display panel 110 by a chip on glass (COG) or chip on panel (COP) method or may be implemented by a chip on film (COF) method and connected with the display panel 110.

The gate driving circuit 130 may output a gate signal of a turn-on level voltage or a gate signal of a turn-off level voltage according to the control of the controller 140. The gate driving circuit 130 may sequentially drive the plurality of gate lines GL by sequentially supplying gate signals of the turn-on level voltage to the plurality of gate lines GL.

The gate driving circuit 130 may be connected with the display panel 110 by TAB method or connected to a bonding pad of the display panel 110 by a COG or COP method or may be connected with the display panel 110 according to a COF method. Alternatively, the gate driving circuit 130 may be formed in a gate in panel (GIP) type, in the non-display area NDA of the display panel 110. The gate driving circuit 130 may be disposed on the substrate SUB or may be connected to the substrate SUB. In other words, the gate driving circuit 130 that is of a GIP type may be disposed in the non-display area NDA of the substrate SUB. The gate driving circuit 130 that is of a chip-on-glass (COG) type or chip-on-film (COF) type may be connected to the substrate SUB.

Meanwhile, at least one of the data driving circuit 120 and the gate driving circuit 130 may be disposed in the display area DA. For example, at least one of the data driving circuit 120 and the gate driving circuit 130 may be disposed not to overlap the subpixels SP or to overlap all or some of the subpixels SP.

When a specific gate line GL is opened by the gate driving circuit 130, the data driving circuit 120 may convert the image data Data received from the controller 140 into an analog data voltage and supply it to the plurality of data lines DL.

The data driving circuit 120 may be connected to one side (e.g., an upper or lower side) of the display panel 110. Depending on the driving scheme or the panel design scheme, data driving circuits 120 may be connected with both the sides (e.g., both the upper and lower sides) of the display panel 110, or two or more of the four sides of the display panel 110.

The gate driving circuit 130 may be connected to one side (e.g., a left or right side) of the display panel 110. Depending on the driving scheme or the panel design scheme, gate driving circuits 130 may be connected with both the sides (e.g., both the left and right sides) of the display panel 110, or two or more of the four sides of the display panel 110.

The controller 140 may be a timing controller used in typical display technology, a control device that may perform other control functions as well as the functions of the timing controller, or a control device other than the timing controller, or may be a circuit in the control device. The controller 140 may be implemented as various circuits or electronic components, such as an integrated circuit (IC), a field programmable gate array (FPGA), an application specific integrated circuit (ASIC), or a processor.

The controller 140 may be mounted on a printed circuit board or a flexible printed circuit and may be electrically connected with the data driving circuit 120 and the gate driving circuit 130 through the printed circuit board or the flexible printed circuit.

The controller 140 may transmit/receive signals to/from the data driving circuit 120 according to one or more predetermined interfaces. The interface may include, e.g., a low voltage differential signaling (LVDS) interface, an embedded clock point to point interface (EPI), and a serial peripheral interface (SPI).

The controller 140 may include a storage medium, such as one or more registers.

The display device 100 according to embodiments of the disclosure may be a display including a backlight unit, such as a liquid crystal display, or may be a self-emission display, such as an organic light emitting diode (OLED) display, a quantum dot display, or a micro light emitting diode (LED) display.

If the display device 100 according to embodiments of the disclosure is an OLED display, each subpixel SP may include an organic light emitting diode (OLED), which by itself emits light, as the light emitting element. If the display device 100 according to embodiments of the disclosure is a quantum dot display, each subpixel SP may include a light emitting element formed of a quantum dot, which is a self-luminous semiconductor crystal. If the display device 100 according to embodiments of the disclosure is a micro LED display, each subpixel SP may include a micro LED, which is self-emissive and formed of an inorganic material, as the light emitting element.

Figure 2A:
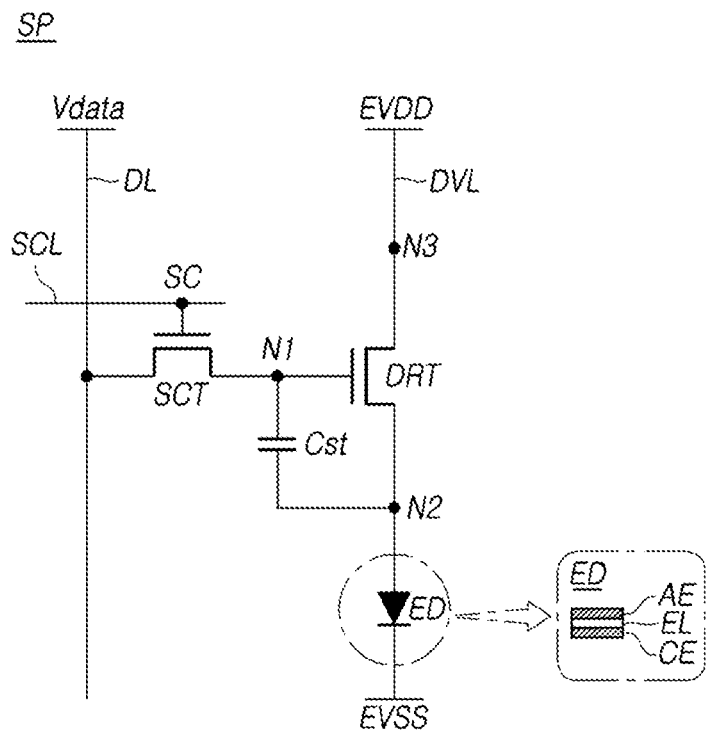
FIGS. 2A and 2B are equivalent circuit diagrams illustrating a subpixel of a display device according to embodiments of the disclosure.
Figure 2B:
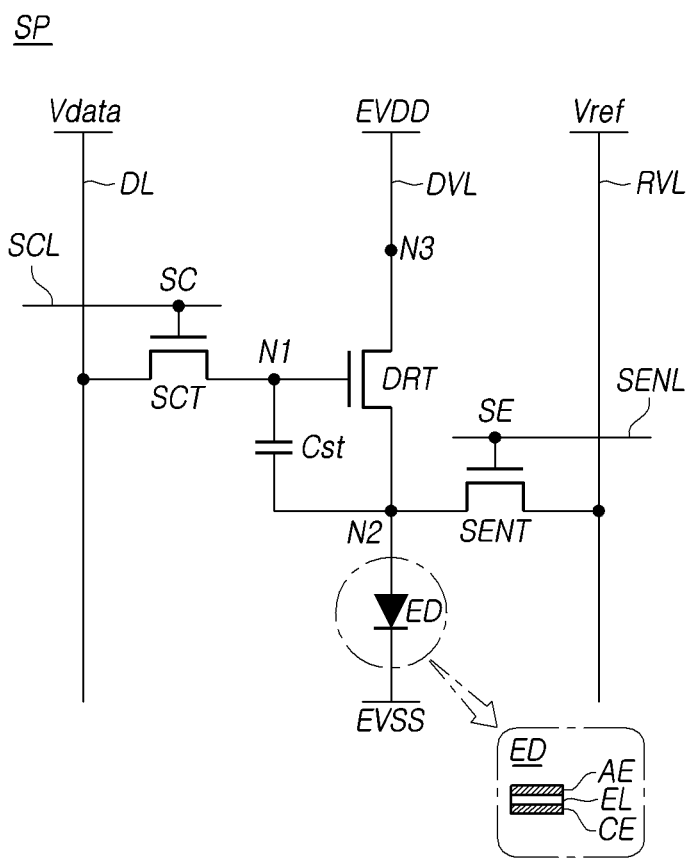

FIGS. 2A and 2B are equivalent circuit diagrams illustrating a subpixel SP of a display device 100 according to embodiments of the disclosure.

Referring to FIG. 2A, each of a plurality of subpixels SP disposed on a display panel 110 of a display device 100 according to embodiments of the disclosure may include a light emitting element ED, a driving transistor DRT, a scan transistor SCT, and a storage capacitor Cst.

Referring to FIG. 2A, the light emitting element ED may include an anode electrode AE and a cathode electrode CE and may include a light emitting layer EL positioned between the anode electrode AE and the cathode electrode CE. A base voltage EVSS may be applied to the cathode electrode CE of the light emitting element ED.

The anode electrode AE of the light emitting element ED may be a pixel electrode disposed in each subpixel SP, and the cathode electrode CE may be a common electrode commonly disposed in all the subpixels SP. Thus, the anode electrode AE may be a pixel electrode, and the cathode electrode CE may be a common electrode. Conversely, the anode electrode AE may be a common electrode, and the cathode electrode CE may be a pixel electrode.

For example, the light emitting element ED may be an organic light emitting diode (OLED), an inorganic material-based light emitting diode (LED), or a quantum dot light emitting element.

The driving transistor DRT is a transistor for driving the light emitting element ED, and may include a first node N1, a second node N2, and a third node N3.

The first node N1 of the driving transistor DRT may be a gate node of the driving transistor DRT, and may be electrically connected with a source node or a drain node of the scan transistor SCT. The second node N2 of the driving transistor DRT may be a source node or a drain node of the driving transistor DRT, and may be electrically connected with a source node or a drain node of the sensing transistor SENT and may also be electrically connected with the anode electrode AE of the light emitting element ED. The third node N3 of the driving transistor DRT may be electrically connected with a driving voltage line DVL supplying a driving voltage EVDD.

The scan transistor SCT may be controlled by a scan signal SC, which is a type of gate signal, and may be connected between the first node N1 of the driving transistor DRT and the data line DL. In other words, the scan transistor SCT may be turned on or off according to the scan signal SC supplied from the scan signal line SCL, which is a type of the gate line GL, controlling the connection between the data line DL and the first node N1 of the driving transistor DRT.

The scan transistor SCT may be turned on by the scan signal SC having a turn-on level voltage and transfer the data voltage Vdata supplied from the data line DL to the first node N1 of the driving transistor DRT.

If the scan transistor SCT is an n-type transistor, the turn-on level voltage of the scan signal SC may be a high level voltage. If the scan transistor SCT is a p-type transistor, the turn-on level voltage of the scan signal SC may be a low level voltage.

The storage capacitor Cst may be electrically connected between the first node N1 and second node N2 of the driving transistor DRT. The storage capacitor Cst is charged with the quantity of electric charge corresponding to the voltage difference between both ends thereof and serves to maintain the voltage difference between both ends for a predetermined frame time. Accordingly, during the predetermined frame time, the corresponding subpixel SP may emit light.

Referring to FIG. 2B, each of the plurality of subpixels SP disposed on the display panel 110 of the display device 100 according to embodiments of the disclosure may further include a sensing transistor SENT.

The sensing transistor SENT may be controlled by a sensing signal SE, which is a type of gate signal, and may be connected between the second node N2 of the driving transistor DRT and the reference voltage line RVL. In other words, the sensing transistor SENT may be turned on or off according to the sensing signal SE supplied from the sensing signal line SENL, which is another type of the gate line GL, controlling the connection between the reference voltage line RVL and the second node N2 of the driving transistor DRT.

The sensing transistor SENT may be turned on by the sensing signal SE having a turn-on level voltage and transfer a reference voltage Vref supplied from the reference voltage line RVL to the second node N2 of the driving transistor DRT.

The sensing transistor SENT may be turned on by the sensing signal SE having a turn-on level voltage, transferring the voltage of the second node N2 of the driving transistor DRT to the reference voltage line RVL.

If the sensing transistor SENT is an n-type transistor, the turn-on level voltage of the sensing signal SE may be a high level voltage. If the sensing transistor SENT is a p-type transistor, the turn-on level voltage of the sensing signal SE may be a low level voltage.

The function in which the sensing transistor SENT transfers the voltage of the second node N2 of the driving transistor DRT to the reference voltage line RVL may be used upon driving to sense the characteristic value of the subpixel SP. In this case, the voltage transferred to the reference voltage line RVL may be a voltage for calculating the characteristic value of the subpixel SP or a voltage reflecting the characteristic value of the subpixel SP.

In the disclosure, the characteristic value of the subpixel SP may be a characteristic value of the driving transistor DRT or the light emitting element ED. The characteristic value of the driving transistor DRT may include a threshold voltage and mobility of the driving transistor DRT. The characteristic value of the light emitting element ED may include a threshold voltage of the light emitting element ED.

Each of the driving transistor DRT, the scan transistor SCT, and the sensing transistor SENT may be an n-type transistor or a p-type transistor. In the disclosure, for convenience of description, each of the driving transistor DRT, the scan transistor SCT, and the sensing transistor SENT is an n-type transistor.

The storage capacitor Cst is not a parasitic capacitor (e.g., Cgs or Cgd that are internal capacitors existing between the gate node and the source node (or drain node) of the driving transistor DRT,) but may be an external capacitor intentionally designed outside the driving transistor DRT.

The scan signal line SCL and the sensing signal line SENL may be different gate lines GL. In this case, the scan signal SC and the sensing signal SE may be separate gate signals, and the on-off timings of the scan transistor SCT and the on-off timings of the sensing transistor SENT in one subpixel SP may be independent. In other words, the on-off timings of the scan transistor SCT and the on-off timings of the sensing transistor SENT in one subpixel SP may be the same or different.

Alternatively, the scan signal line SCL and the sensing signal line SENL may be the same gate line GL. In other words, the gate node of the scan transistor SCT and the gate node of the sensing transistor SENT in one subpixel SP may be connected with one gate line GL. In this case, the scan signal SC and the sensing signal SE may be the same gate signals, and the on-off timings of the scan transistor SCT and the on-off timings of the sensing transistor SENT in one subpixel SP may be the same.

The structures of the subpixel SP shown in FIGS. 2A and 2B are merely examples, and various changes may be made thereto, e.g., such as including one or more transistors or one or more capacitors.

Although the subpixel structure is described in connection with FIGS. 2A and 2B under the assumption that the display device 100 is a self-emission display device, if the display device 100 is a liquid crystal display, each subpixel SP may include a transistor and a pixel electrode.

Figure 3:
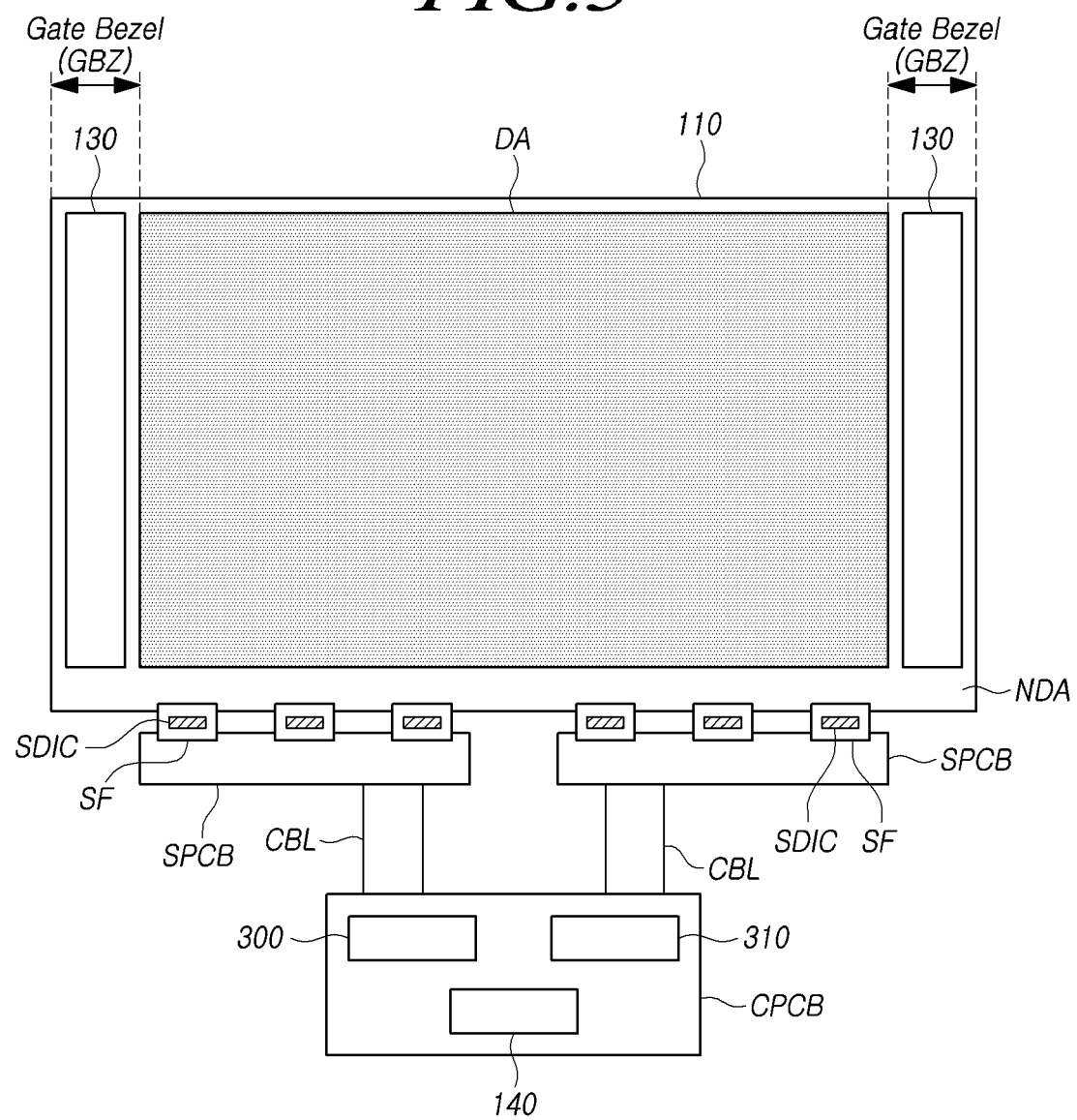
FIG. 3 is a view illustrating an example system configuration of a display device according to embodiments of the disclosure.

FIG. 3 illustrates an example system configuration of a display device 100 according to embodiments of the disclosure.

Referring to FIG. 3, the display panel 110 may include a display area DA in which images are displayed and a non-display area NDA in which no image is displayed.

Referring to FIG. 3, when a data driving circuit 120 includes one or more source driver integrated circuits SDIC and is implemented in a chip-on-film (COF) type, each source driver integrated circuit SDIC may be mounted on a circuit film SF connected to the non-display area NDA of the display panel 110.

Referring to FIG. 3, a gate driving circuit 130 may be implemented in a gate in panel (GIP) type. In this case, the gate driving circuit 130 may be formed in the non-display area NDA of the display panel 110. Unlike FIG. 3, the gate driving circuit 130 may be implemented in a chip on film (COF) type.

The display device 100 may include at least one source printed circuit board SPCB for circuit connection between one or more source driver integrated circuits SDIC and other devices and a control printed circuit board CPCB for mounting control components and various electric devices.

The source driver integrated circuit SDIC-packed film SF may be connected to at least one source printed circuit board SPCB. In other words, one side of the source driver integrated circuit SDIC-packed film SF may be electrically connected with the display panel 110, and the opposite side thereof may be electrically connected with the source printed circuit board SPCB.

A controller 140 and a power management integrated circuit (PMIC) 310 may be mounted on the control printed circuit board CPCB. The controller 140 may perform overall control functions related to driving of the display panel 110, and may control operations of the data driving circuit 120 and the gate driving circuit 130. The power management integrated circuit 310 may supply various voltages or currents to the data driving circuit 120 and the gate driving circuit 130 or may control various voltages or currents to be supplied thereto.

At least one source printed circuit board SPCB and the control printed circuit board CPCB may be circuit-connected through at least one connection cable CBL. Here, the connection cable CBL may be, e.g., a flexible printed circuit (FPC) or a flexible flat cable (FFC).

At least one source printed circuit board SPCB and control printed circuit board CPCB may be integrated into one printed circuit board.

The display device 100 according to embodiments of the disclosure may further include a level shifter 300 for adjusting a voltage level. For example, the level shifter 300 may be disposed on a control printed circuit board CPCB or a source printed circuit board SPCB.

In particular, in the display device 100 according to embodiments of the disclosure, the level shifter 300 may supply signals necessary for gate driving to the gate driving circuit 130. For example, the level shifter 300 may supply a plurality of clock signals to the gate driving circuit 130. Accordingly, the gate driving circuit 130 may output the plurality of gate signals to the plurality of gate lines GL based on the plurality of clock signals input from the level shifter 300. The plurality of gate lines GL may transfer the plurality of gate signals to the subpixels SP disposed in the display area DA of the substrate SUB.

Referring to FIG. 3, an area in the non-display area NDA of the display panel 110 where the gate driving circuit 130 and related lines are disposed is called a gate bezel GBZ.

Referring to FIG. 3, various lines necessary for the operation of the gate driving circuit 130, as well as the gate driving circuit 130 should be disposed on the gate bezel GBZ. Here, various lines necessary for the operation of the gate driving circuit 130 may include a plurality of gate clock lines, a high level gate voltage line, and a low level gate voltage line. The structure of the gate bezel GBZ of the display panel 110 according to embodiments of the disclosure is described below.

Figure 4:
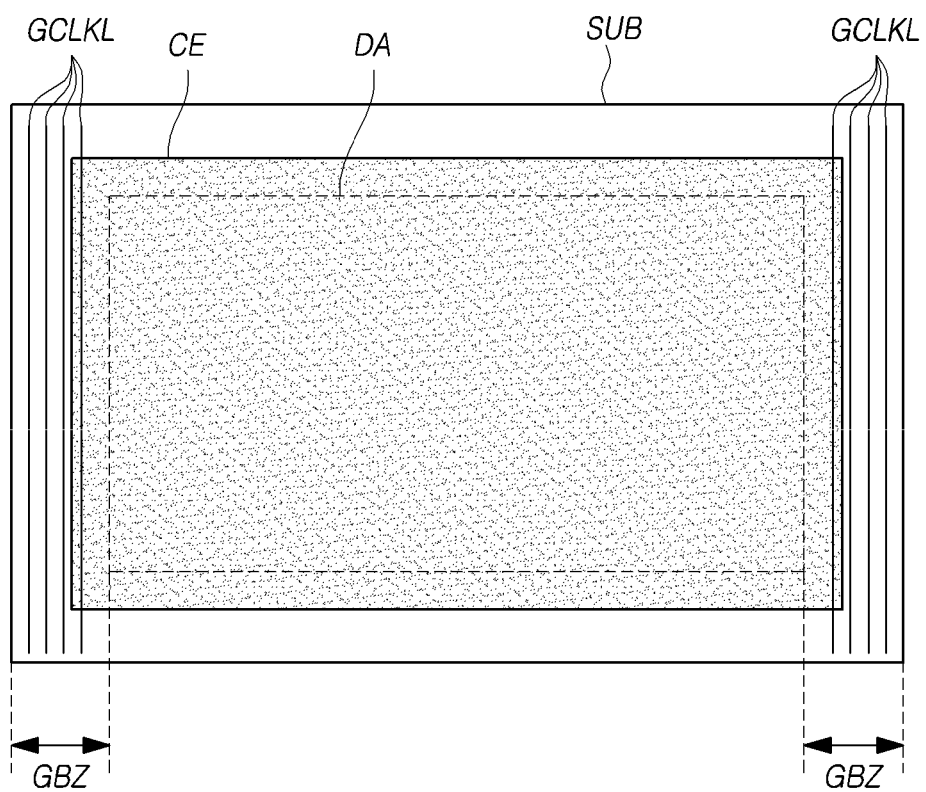
FIG. 4 is a view illustrating a cathode electrode disposed on a display panel according to embodiments of the disclosure.

FIG. 4 is a view illustrating a cathode electrode CE disposed on a display panel 110 according to embodiments of the disclosure.

Referring to FIG. 4, the display panel 110 according to embodiments may include a cathode electrode CE that acts as the cathode in the LED for forming the light emitting element ED of each subpixel SP.

Referring to FIG. 4, in the display panel 110, the substrate SUB may include a display area DA in which images are displayed and a non-display area NDA in which no image is displayed. A plurality of subpixels SP may be disposed in the display area DA. The non-display area NDA may be an area outside the display area DA.

Referring to FIG. 4, in the display panel 110, the cathode electrode CE may be disposed on the substrate SUB, may be disposed in the entire display area DA, and may extend to a portion of the non-display area NDA.

Referring to FIG. 4, the non-display area NDA may include a gate bezel GBZ corresponding to an area in which the gate driving circuit 130 and related lines are disposed. The cathode electrode CE may extend to a partial area of the gate bezel GBZ. In other words, the cathode electrode CE may overlap a portion of the gate bezel GBZ.

The cathode electrode CE is a type of display driving electrode for configuring the light emitting elements ED and may be an electrode to which the base voltage EVSS is applied. For example, the base voltage EVSS applied to the cathode electrode CE may be a ground voltage.

The gate driving circuit 130 may be disposed on the gate bezel GBZ.

The gate driving circuit 130 may be disposed only on the first side (e.g., left side) of the display area DA, or may be disposed on both the first side (e.g., left side) and the second side (e.g., right side) of the display area DA. Accordingly, the presence position of the gate bezel GBZ may vary. In other words, the gate bezel GBZ may be present only on the first side (e.g., the left side) of the display area DA, or may be present on both the first side (e.g., the left side) and the second side (e.g., the right side) of the display area DA.

Further, a plurality of gate clock lines GCLKL for supplying gate clock signals necessary for the operation of the gate driving circuit 130 to the gate driving circuit 130 may be disposed on the gate bezel GBZ.

The number of gate clock lines GCLKL may vary depending on the gate driving method. For example, the number of gate clock lines GCLKL may be 2, 4, 6, or 8.

The plurality of gate clock lines GCLKL may be disposed only on the first side (e.g., the left side) of the display area DA, or may be disposed on both the first side (e.g., the left side) and the second side (e.g., the right side) of the display area DA.

Further, a high-level gate voltage line for supplying the high-level gate voltage required for the operation of the gate driving circuit 130 to the gate driving circuit 130 may be disposed on the gate bezel GBZ.

Further, a low-level gate voltage line for supplying the low-level gate voltage required for the operation of the gate driving circuit 130 to the gate driving circuit 130 may be disposed on the gate bezel GBZ.

Meanwhile, in the gate bezel GBZ, when the cathode electrode CE overlaps at least one of the plurality of gate clock lines GCLKL, a capacitor may be formed between at least one of the plurality of gate clock lines GCLKL and the cathode electrode CE. In this capacitor, the cathode electrode acts as one plate of a capacitor and a gate clock line act as a second plate of the capacitor, or multiple gate clock lines can act as second, third, fourth etc. plates of one or more capacitors. As the voltage difference between the cathode electrode and one or more clock lines vary, the affect these capacitors on the circuit also varies.

The capacitor formed between the cathode electrode CE and the gate clock line GCLKL may correspond to an unwanted unnecessary parasitic capacitor, and may have an unwanted effect on both the cathode electrode CE and the gate clock line GCLKL. It may therefore alter in a negative way the timing and amplitude of the gate clock signals as they are being provided to the display area. Since the cathode electrode CE will be held at ground or ELVSS in many embodiments, as the clock signal drives the gates and they will transition from a low voltage to a high voltage and back to a low voltage, capacitive loading may occur.

For example, the capacitor induced in at least one of the plurality of gate clock lines GCLKL by the cathode electrode CE may act as an unnecessary load or may cause deformation of the gate clock signal, thereby performing an abnormal gate driving operation, with the result of deterioration of image quality.

Even if a capacitor is formed between the plurality of gate clock lines GCLKL and the cathode electrode CE in the display panel 110, no issue may arise if the capacitor deviation does not occur.

However, even if the panel design is made so that the plurality of gate clock lines GCLKL do not overlap the cathode electrode CE, some of the plurality of gate clock lines GCLKL are likely to overlap the cathode electrode CE due to a process error that inevitably occurs when the panel is manufactured.

The above-described load deviation (also referred to as "capacitance load deviation") in the gate clock line GCLKL by the cathode electrode CE may cause abnormal gate driving with the result of an image abnormality. For example, an abnormal horizontal line may be visible on the screen.

Accordingly, the display panel 110 according to embodiments of the disclosure discloses three structures of the gate bezel GBZ capable of reducing load deviation in the gate clock line GCLKL by the cathode electrode CE.

Figure 5:
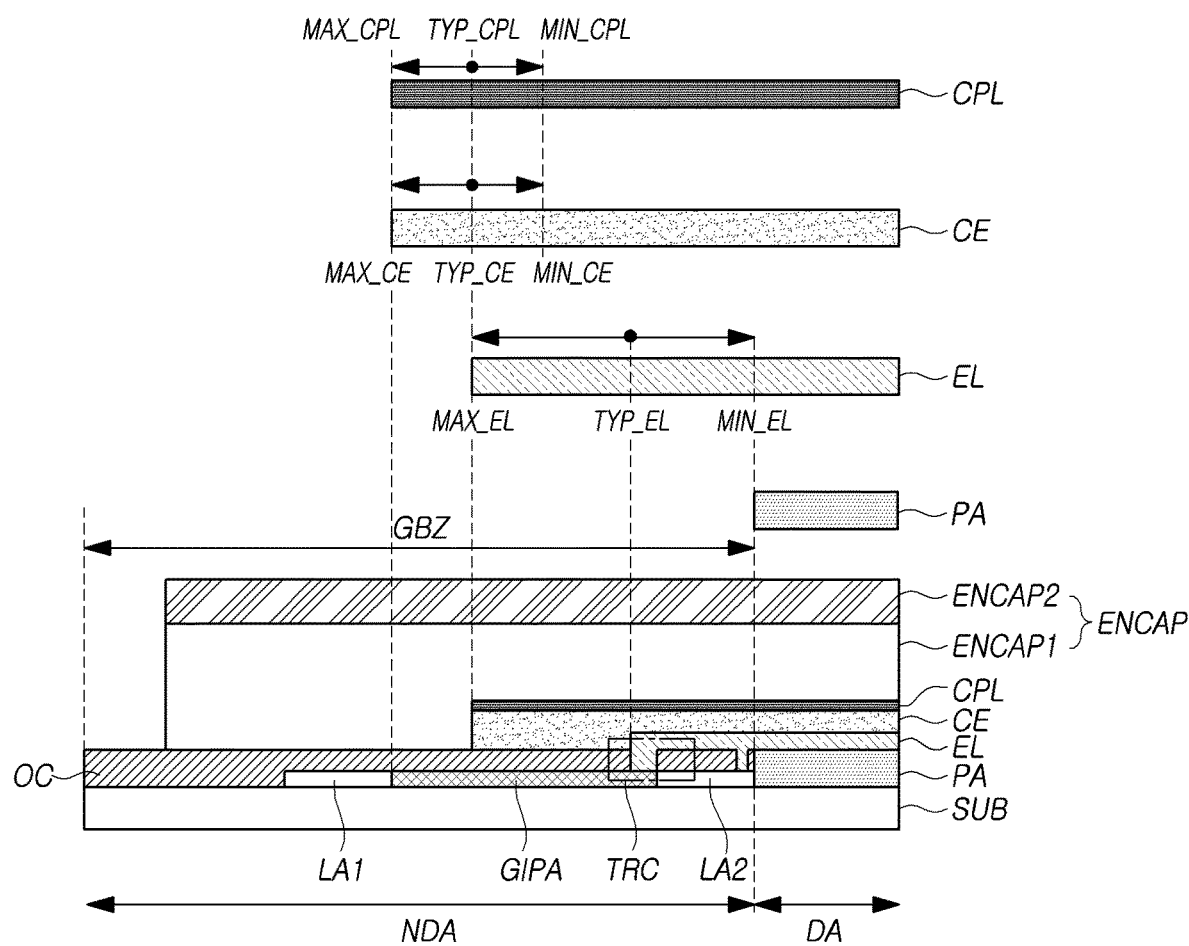
FIG. 5 is a cross-sectional view illustrating a first vertical structure of a gate bezel of a display panel according to embodiments of the disclosure.

FIG. 5 is a cross-sectional view illustrating a first vertical structure of a gate bezel GBZ of a display panel 110 according to embodiments of the disclosure.

Referring to FIG. 5, a display panel 110 according to embodiments of the disclosure may include a substrate SUB having a display area DA and a non-display area NDA, a cathode electrode CE disposed in the display area DA and extending to the non-display area NDA, a gate driving circuit 130 disposed on the substrate SUB and disposed in a gate driving circuit area GIPA in the non-display area NDA, a plurality of gate clock lines GCLKL disposed on the substrate SUB and disposed in a first line area LA1 positioned outside a gate driving circuit area GIPA in the non-display area NDA, and an overcoat layer OC disposed on the plurality of gate clock lines GCLKL and the gate driving circuit 130.

Referring to FIG. 5, when the display panel 110 according to embodiments of the disclosure has the first vertical structure of the gate bezel GBZ, the plurality of gate clock lines GCLKL disposed in the first line area LA1 may be disposed not to overlap the cathode electrode CE. A vertical structure is a layer that extends for a height, namely a layer of selected thickness.

Because of the first vertical structure of the gate bezel GBZ, a capacitor is not formed between all of the plurality of gate clock lines GCLKL disposed on the gate bezel GBZ and the cathode electrode CE, and the capacitor load deviation does not exist.

Referring to FIG. 5, in the display panel 110 according to embodiments of the disclosure, at least a portion of the cathode electrode CE may overlap the gate driving circuit 130.

Referring to FIG. 5, a high-level gate voltage line may be disposed in the first line area LA1.

Referring to FIG. 5, the display panel 110 according to embodiments of the disclosure may further include a low-level gate voltage line disposed on the substrate SUB and disposed in a second line area LA2 positioned inside the gate driving circuit area GIPA in the non-display area NDA.

Referring to FIG. 5, the display panel 110 according to embodiments of the disclosure may further include an anode electrode AE disposed in the display area DA and a light emitting layer EL disposed on the anode electrode AE.

The anode electrode AE, the light emitting layer EL, and the cathode electrode CE may constitute the light emitting element ED of the subpixel SP in the display area DA. The light emitting element ED may be formed in the pixel area PA of each subpixel SP in the display area DA.

The overcoat layer OC may include a trench TRC. The trench TRC of the overcoat layer OC may be positioned in the non-display area NDA. The overcoat layer is positioned between the CE and the GCLKL, thus reducing or preventing completely the formation of the capacitor at location where they overlap. Capacitance is determined by the equation C=KA/d, in which K is a capacitive constant, including the dielectric value, A is the area and d is the distance between the plates. By increasing the distance d the value of any capacitor formed between the CE and the GCLKL is reduced or eliminated. The layer OC between the CE and GCLKL increases the distance between them and reduces or fully eliminates and capacitive loading that may occur between these two conductors.

The light emitting layer EL may extend to the non-display area NDA and be present inside the trench TRC of the overcoat layer OC.

Referring to FIG. 5, the display panel 110 according to embodiments of the disclosure may further include a capping layer CPL on the cathode electrode CE, a first encapsulation layer ENCAP1 disposed on the capping layer CPL, and a second encapsulation layer ENCAP2.

For example, the first encapsulation layer ENCAP1 may include a desiccant. The second encapsulation layer ENCAP2 may be disposed to cover the cathode electrode CE, the capping layer CPL, and the first encapsulation layer ENCAP1.

The second encapsulation layer ENCAP2 may overlap the plurality of gate clock lines GCLKL and the gate driving circuit 130.

When manufacturing the display panel 110, each of the light emitting layer EL, the cathode electrode CE, and the capping layer CPL may have a size corresponding to the design and may be precisely formed at a position corresponding to the design.

When a process error occurs when manufacturing the display panel 110, at least one of the light emitting layer EL, the cathode electrode CE, and the capping layer CPL may be formed in a size different from the size corresponding to the design, or may be formed at a position different from the position corresponding to the design.

For example, the edge position of the light emitting layer EL may be positioned between the maximum edge position MAX_EL and the minimum edge position MIN_EL.

The maximum edge position MAX_EL as the edge position of the light emitting layer EL may be positioned further outside than the normal position TYP_EL corresponding to the design, and may be the edge position of the light emitting layer EL when the light emitting layer EL is disposed to extend maximally to the outside. Having the layer EL also present between the CE and the GCLKL also acts to increase the distance d between them. Thus, having the layer EL extend into the non-display area and for the distance TYP_EL or MAX_EL will further reduce the capacitance load. The anode is not present outside of the pixel area PA, therefore an LED is not formed and an LED is not present even though the CE is directly on the EL.

The minimum edge position MIN_EL as the edge position of the light emitting layer EL may be positioned further inside than the normal position TYP_EL corresponding to the design, and may be the edge position of the light emitting layer EL when the light emitting layer EL is disposed to extend minimally to the outside.

For example, the edge position of the cathode electrode CE may be positioned between the maximum edge position MAX_CE and the minimum edge position MIN_CE.

The maximum edge position MAX_CE as the edge position of the cathode electrode CE may be positioned further outside than the normal position TYP_CE corresponding to the design, and may be the edge position of the cathode electrode CE when the cathode electrode CE is disposed to extend maximally to the outside.

As the edge position of the cathode electrode CE, the minimum edge position MIN_CE may be positioned further inside than the normal position TYP_CE corresponding to the design, and may be the edge position of the cathode electrode CE when the cathode electrode CE is disposed to extend minimally to the outside.

The general normal position TYP_CE corresponding to the design of the cathode electrode CE may be positioned further outside than the general normal position TYP_EL corresponding to the design of the light emitting layer EL.

The maximum edge position MAX_CE of the cathode electrode CE may be positioned further outside the maximum edge position MAX_EL of the light emitting layer EL.

For example, the edge position of the capping layer CPL may be positioned between the maximum edge position MAX_CPL and the minimum edge position MIN_CPL.

The maximum edge position MAX_CPL as the edge position of the capping layer CPL may be positioned further outside than the normal position TYP_CPL corresponding to the design, and may be the edge position of the capping layer CPL when the capping layer CPL is disposed to extend maximally to the outside.

The minimum edge position MIN_CPL as the edge position of the capping layer CPL may be positioned further inside than the normal position TYP_CPL corresponding to the design, and may be the edge position of the capping layer CPL when the capping layer CPL is disposed to extend minimally to the outside.

The edge position of the capping layer CPL may correspond to the edge position of the cathode electrode CE.

As described above, when the display panel 110 according to the embodiments of the disclosure has the first vertical structure of the gate bezel GBZ, no capacitor is formed between all of the plurality of gate clock lines GCLKL disposed on the gate bezel GBZ and the cathode electrode CE, nor is there a capacitor load deviation.

However, when the display panel 110 according to embodiments of the disclosure has the first vertical structure of the gate bezel GBZ, the gate bezel GBZ area and height may slightly increase.

Hereinafter, a second vertical structure of the gate bezel GBZ of the display panel 110 according to further embodiments of the disclosure is described.

Figure 6:
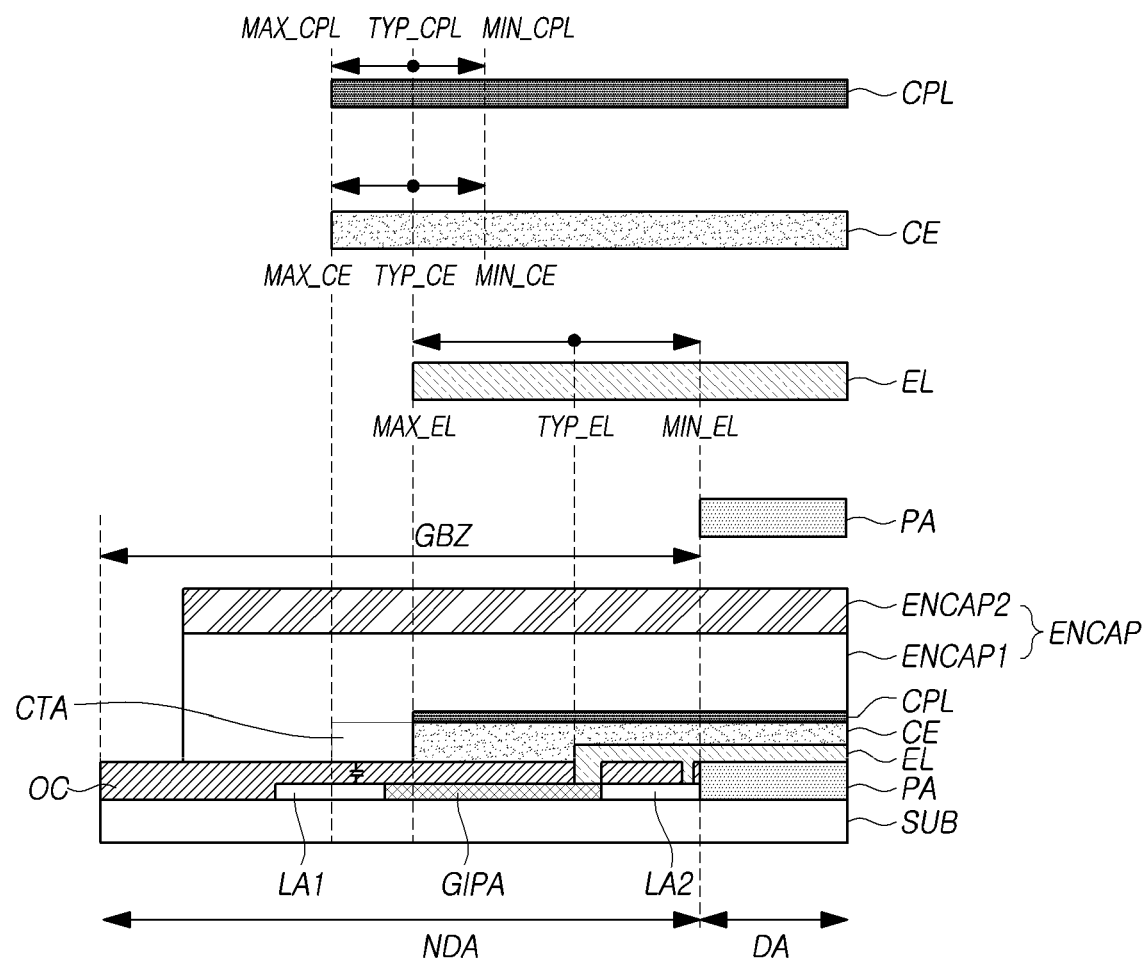
FIG. 6 is a cross-sectional view illustrating a second vertical structure of a gate bezel of a display panel according to embodiments of the disclosure.

FIG. 6 is a cross-sectional view illustrating a second vertical structure of a gate bezel GBZ of a display panel 110 according to embodiments of the disclosure.

The second vertical structure of FIG. 6 includes the same layers and materials as the first vertical structure of FIG. 5. Therefore, the following description focuses primarily on matters different from the first vertical structure of FIG. 5.

Referring to FIG. 6, it is desired to reduce the gate bezel GBZ for a narrow bezel, and to this end, the gate driving circuit 130 of the GIP type may be simplified. Accordingly, the first line area LA1 and the gate driving circuit area GIPA in which the plurality of gate clock lines GCLKL are disposed may be close to the display area DA.

In this case, the first line area LA1 in which the plurality of gate clock lines GCLKL are disposed may enter below the cathode electrode CE.

When the plurality of gate clock lines GCLKL are disposed in the tolerance area CTA of the cathode electrode CE, the area in which at least one of the plurality of gate clock lines GCLKL and the cathode electrode CE overlap may vary for each position in one display panel 110 or may vary for each of several display panels 110 due to a process deviation when the cathode electrode CE is deposited. In the embodiment of FIG. 6, the bezel is more narrow, resulting in the GIPA being shorter and the two line areas LA1 and LA2 are closer to each other. As a result, the line area LA1 is closer to the cathode electrode CE and there is a greater chance for capacitive coupling errors.

Accordingly, the respective capacitor loads of the plurality of gate clock lines GCLKL may be different from each other. In other words, a capacitor load deviation between a plurality of gate clock lines GCLKL may occur. This capacitor load deviation may cause horizontal line generation in the image.

Figure 7:
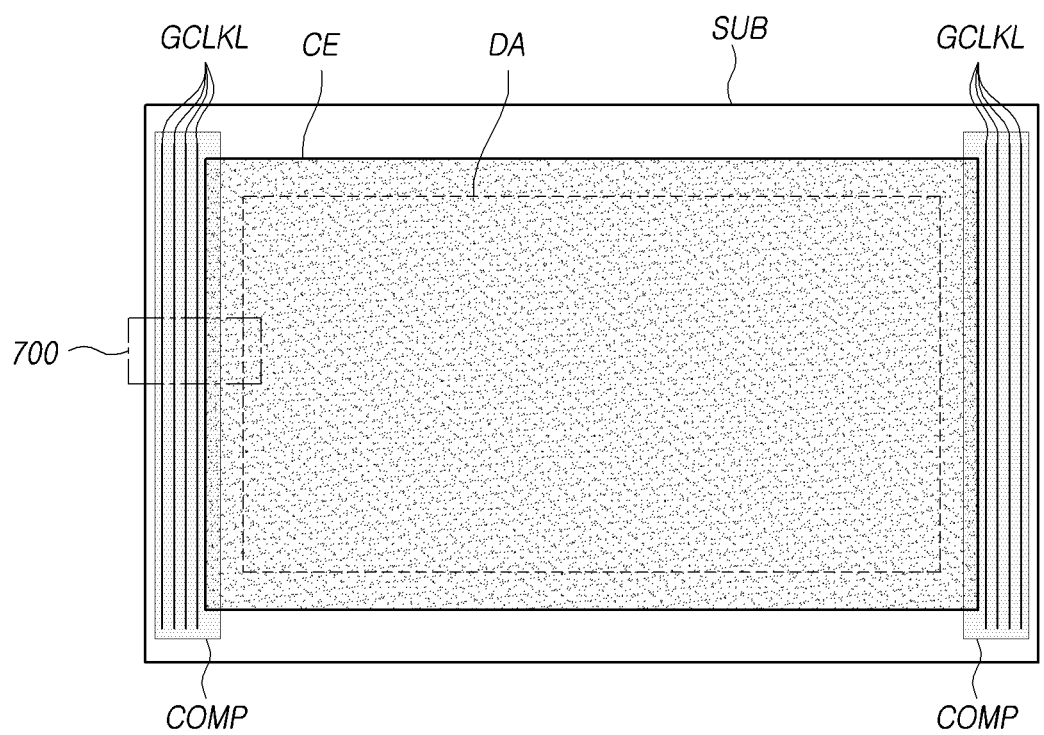
FIG. 7 is a view illustrating a cathode electrode nd a load deviation compensation pattern disposed on a display panel according to embodiments of the disclosure.
Figure 8:
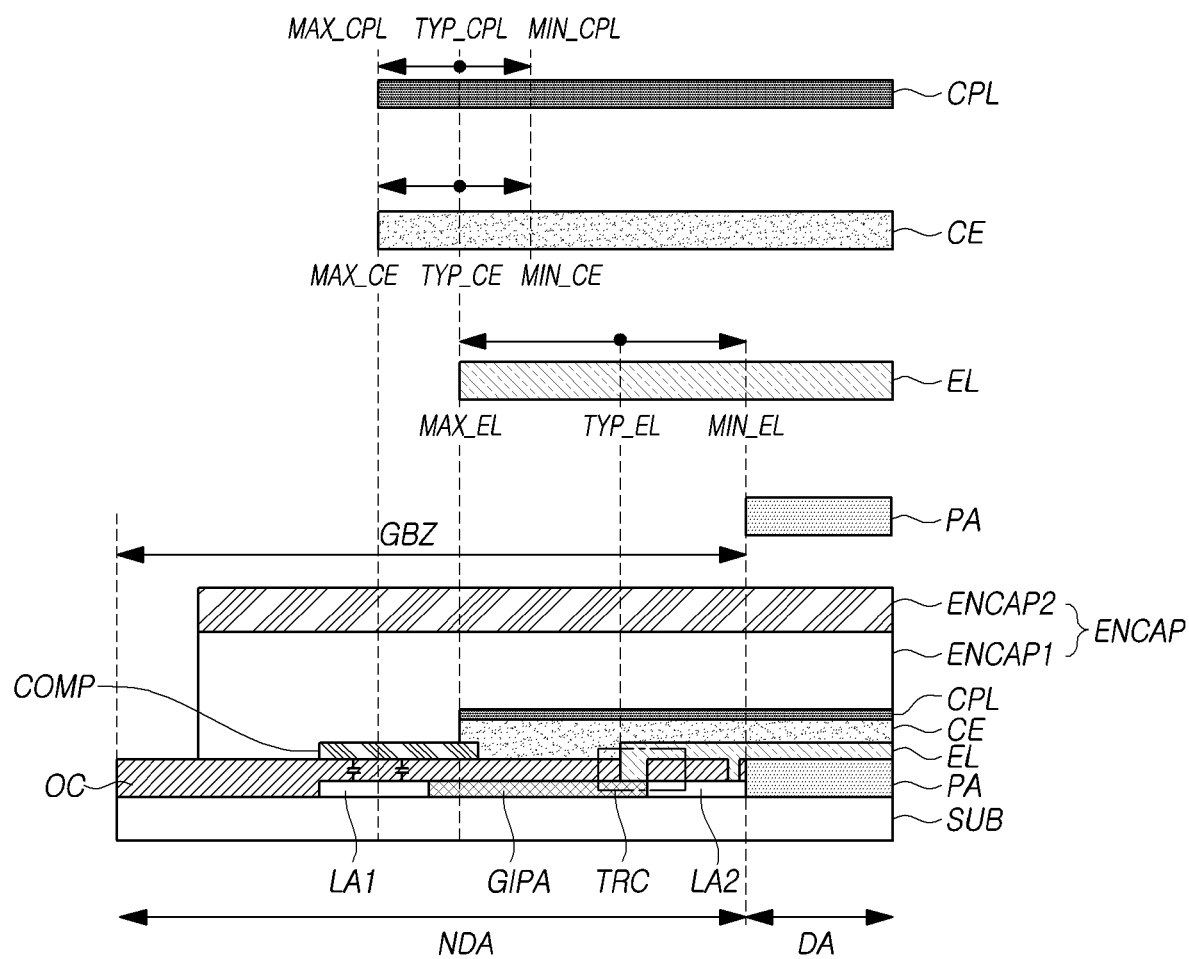
FIG. 8 is a cross-sectional view illustrating a third vertical structure of a gate bezel of a display panel according to embodiments of the disclosure.
Figure 9:
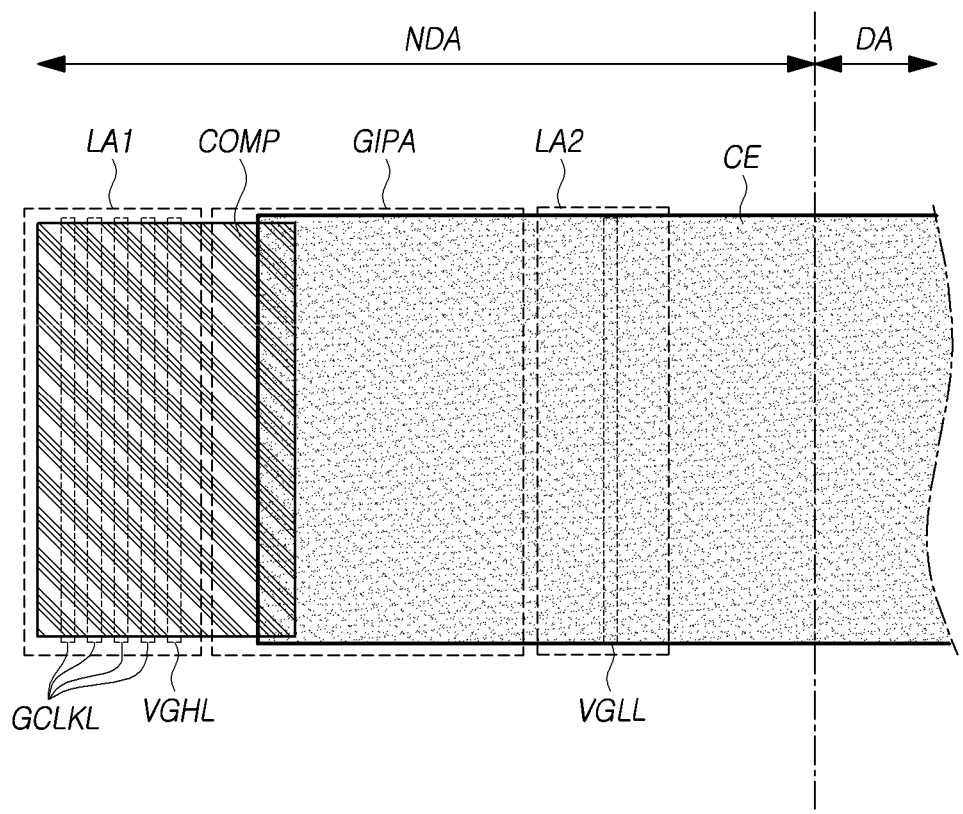
FIG. 9 is a plan view illustrating a third vertical structure of a gate bezel of a display panel according to embodiments of the disclosure.

Hereinafter, a third vertical structure of the gate bezel GBZ of the display panel 110 according to embodiments of the disclosure is described as shown in FIGS. 7, 8 and 9. The display panel 110 according to embodiments of the disclosure may have a third vertical structure of the gate bezel GBZ, thereby allowing for a narrow bezel and mitigating a capacitor load deviation.

FIG. 7 illustrates a load deviation compensation pattern COMP for a third vertical structure of a display panel 110 according to embodiments of the disclosure.

Referring to FIG. 7, when the display panel 110 according to embodiments of the disclosure has a third vertical structure, the display panel 110 may include a load deviation compensation pattern COMP disposed in the non-display area NDA and overlapping the plurality of gate clock lines GCLKL.

Referring to FIG. 7, since the display panel 110 has a third vertical structure including a load deviation compensation pattern COMP overlapping the plurality of gate clock lines GCLKL, a capacitor load deviation between the plurality of gate clock lines GCLKL may be reduced while reducing the gate bezel GBZ of the display panel 110.

FIG. 8 is a cross-sectional view illustrating a third vertical structure of the gate bezel GBZ of the display panel 110 according to embodiments of the disclosure, and FIG. 9 is a plan view illustrating a third vertical structure of the gate bezel GBZ of the display panel 110 according to embodiments of the disclosure. FIG. 8 is a cross-sectional view illustrating a partial area 700 of FIG. 7 illustrating the third vertical structure, and FIG. 9 is a plan view illustrating the partial area 700 of FIG. 7 illustrating the third vertical structure.

Referring to FIGS. 8 and 9, a display panel 110 according to embodiments of the disclosure may include a substrate SUB where a display area DA and a non-display area NDA are divided, a gate driving circuit 130 disposed on the substrate SUB and disposed in a gate driving circuit area GIPA in the non-display area NDA, a plurality of gate clock lines GCLKL disposed on the substrate SUB and disposed in a first line area LA1 positioned outside a gate driving circuit area GIPA in the non-display area NDA, an overcoat layer OC disposed on the plurality of gate clock lines GCLKL and the gate driving circuit 130, and a cathode electrode CE disposed in the display area DA and extending to the non-display area NDA.

Referring to FIGS. 8 and 9, the display panel 110 according to embodiments of the disclosure may include a load deviation compensation pattern COMP overlapping all of the plurality of gate clock lines GCLKL.

Referring to FIGS. 8 and 9, the load deviation compensation pattern COMP may be positioned on the plurality of gate clock lines GCLKL. The overcoat layer OC may be disposed between the plurality of gate clock lines GCLKL and the load deviation compensation pattern COMP.

Referring to FIGS. 8 and 9, the load deviation compensation pattern COMP, together with the plurality of gate clock lines GCLKL, may form a capacitor. However, since the load deviation compensation pattern COMP overlaps all of the plurality of gate clock lines GCLKL, even if a process deviation occurs, no capacitor load deviation may occur between it and the plurality of gate clock lines GCLKL.

Referring to FIGS. 8 and 9, the load deviation compensation pattern COMP may be connected to the cathode electrode CE.

Referring to FIGS. 8 and 9, the cathode electrode CE may be positioned on a higher layer than the load deviation compensation pattern COMP. Accordingly, the cathode electrode CE may contact a side surface and an upper surface of one end of the load deviation compensation pattern COMP.

Referring to FIGS. 8 and 9, the load deviation compensation pattern COMP may overlap at least a portion of the gate driving circuit 130.

Referring to FIGS. 8 and 9, the cathode electrode CE may be positioned on the overcoat layer OC, and at least a portion of the cathode electrode CE may overlap the gate driving circuit 130.

Referring to FIGS. 8 and 9, the display panel 110 according to embodiments of the disclosure may further include an anode electrode AE disposed in the display area DA and the light emitting layer EL disposed on the anode electrode AE, and the anode electrode AE, the light emitting layer EL, and the cathode electrode CE may constitute the light emitting element ED of the subpixel SP in the display area DA.

For example, the load deviation compensation pattern COMP may include the same material as the anode electrode AE. In other words, when the anode electrode AE is formed to configure the light emitting element ED in the display area DA, the load deviation compensation pattern COMP may be formed together. The load deviation compensation pattern COMP is not coupled to anode voltage circuits. It can be left floating in one embodiment, which will reduce or fully eliminate all capacitive coupling issues between the line area LA1 and the cathode electrode CE. As previously noted, the cathode electrode CE will be held at ground or ELVSS in many embodiments and having the load deviation compensation pattern between it and the line area LA1 will reduce the capacitive coupling.

Referring to FIGS. 8 and 9, in the display panel 110 according to embodiments of the disclosure, the overcoat layer OC may include a trench TRC. The trench TRC of the overcoat layer OC may be positioned in the non-display area NDA.

The light emitting layer EL may extend to the non-display area NDA and be interposed inside the trench TRC of the overcoat layer OC.

Referring to FIGS. 8 and 9, the display panel 110 according to embodiments of the disclosure may further include a low level gate voltage line VGLL disposed on the substrate SUB and disposed in a second line area LA2 positioned inside the gate driving circuit area GIPA in the non-display area NDA.

Referring to FIGS. 8 and 9, in the display panel 110 according to embodiments of the disclosure, a high-level gate voltage line VGHL may be disposed in the first line area LAL.

Referring to FIGS. 8 and 9, the display panel 110 according to embodiments of the disclosure may further include a capping layer CPL on the cathode electrode CE, a first encapsulation layer ENCAP1 disposed on the capping layer CPL, and a second encapsulation layer ENCAP2 covering the cathode electrode CE, the capping layer CPL, the first encapsulation layer ENCAP1, and the load deviation compensation pattern COMP.

The second encapsulation layer ENCAP2 may overlap the plurality of gate clock lines GCLKL and the gate driving circuit 130.

Referring to FIG. 8, if a process error occurs when the display panel 110 is manufactured, at least one of the light emitting layer EL, the cathode electrode CE, and the capping layer CPL may be formed in a side different from the size corresponding to the design, or may be formed at a position different from the position corresponding to the design.

For example, the edge position of the light emitting layer EL may be positioned between the maximum edge position MAX_EL and the minimum edge position MIN_EL.

The maximum edge position MAX_EL as the edge position of the light emitting layer EL may be positioned further outside than the normal position TYP_EL corresponding to the design, and may be the edge position of the light emitting layer EL when the light emitting layer EL is disposed to extend maximally to the outside.

The minimum edge position MIN_EL as the edge position of the light emitting layer EL may be positioned further inside than the normal position TYP_EL corresponding to the design, and may be the edge position of the light emitting layer EL when the light emitting layer EL is disposed to extend minimally to the outside.

For example, the edge position of the cathode electrode CE may be positioned between the maximum edge position MAX_CE and the minimum edge position MIN_CE.

The maximum edge position MAX_CE as the edge position of the cathode electrode CE may be positioned further outside than the normal position TYP_CE corresponding to the design, and may be the edge position of the cathode electrode CE when the cathode electrode CE is disposed to extend maximally to the outside.

As the edge position of the cathode electrode CE, the minimum edge position MIN_CE may be positioned further inside than the normal position TYP_CE corresponding to the design, and may be the edge position of the cathode electrode CE when the cathode electrode CE is disposed to extend minimally to the outside.

The general normal position TYP_CE corresponding to the design of the cathode electrode CE may be positioned further outside than the general normal position TYP_EL corresponding to the design of the light emitting layer EL.

The maximum edge position MAX_CE of the cathode electrode CE may be positioned further outside the maximum edge position MAX_EL of the light emitting layer EL.

For example, the edge position of the capping layer CPL may be positioned between the maximum edge position MAX_CPL and the minimum edge position MIN_CPL.

The maximum edge position MAX_CPL as the edge position of the capping layer CPL may be positioned further outside than the normal position TYP_CPL corresponding to the design, and may be the edge position of the capping layer CPL when the capping layer CPL is disposed to extend maximally to the outside.

The minimum edge position MIN_CPL as the edge position of the capping layer CPL may be positioned further inside than the normal position TYP_CPL corresponding to the design, and may be the edge position of the capping layer CPL when the capping layer CPL is disposed to extend minimally to the outside.

The edge position of the capping layer CPL may correspond to the edge position of the cathode electrode CE.

As described above, when the display panel 110 according to the embodiments of the disclosure has the third vertical structure of the gate bezel GBZ, a process error occurs in the manufacturing process of the display panel 110, and when the edge position of the cathode electrode CE is the maximum edge position MAX_CE, i.e., when the cathode electrode CE is formed up to the maximum edge position MAX_CE, the cathode electrode CE may overlap at least one of the plurality of gate clock lines GCLKL.

As described above, even if at least one of the plurality of gate clock lines GCLKL overlaps the cathode electrode CE, the load deviation compensation pattern COMP may be present between the plurality of gate clock lines GCLKL and the cathode electrode CE, and thus all of the plurality of gate clock lines GCLKL may form a capacitor with the load deviation compensation pattern COMP.

Accordingly, the capacitor load deviation between the plurality of gate clock lines GCLKL disposed on the gate bezel GBZ may be removed.

Embodiments of the disclosure described above are briefly described below.

A display panel according to embodiments of the disclosure may comprise a substrate in which a display area and a non-display area are divided, a gate driving circuit disposed on the substrate and disposed in a gate driving circuit area within the non-display area, a plurality of gate clock lines disposed on the substrate and disposed in a first line area positioned outside the gate driving circuit area in the non-display area, an overcoat layer disposed on the plurality of gate clock lines and the gate driving circuit, a cathode electrode disposed in the display area and extending to the non-display area, and a load deviation compensation pattern overlapping the plurality of gate clock lines.

In the display panel according to embodiments of the disclosure, the load deviation compensation pattern may be positioned above the plurality of gate clock lines.

In the display panel according to embodiments of the disclosure, the load deviation compensation pattern may form a capacitor with the plurality of gate clock lines.

In the display panel according to embodiments of the disclosure, the load deviation compensation pattern may be connected to the cathode electrode.

In the display panel according to embodiments, the cathode electrode may contact a side surface and an upper surface of one end of the load deviation compensation pattern.

In the display panel according to embodiments of the disclosure, at least a portion of the load deviation compensation pattern may overlap at least a portion of the gate driving circuit.

In the display panel according to embodiments, the cathode electrode may be positioned on the overcoat layer, and at least a portion of the cathode electrode may overlap the gate driving circuit.

In the display panel according to embodiments of the disclosure, at least one of the plurality of gate clock lines may overlap the cathode electrode.

The display panel according to embodiments of the disclosure may further comprise an anode electrode disposed in the display area and a light emitting layer disposed on the anode electrode. The anode electrode, the light emitting layer, and the cathode electrode may constitute a light emitting element of a subpixel in the display area. The load deviation compensation pattern may include the same material as the anode electrode.

In the display panel according to embodiments, the overcoat layer includes a trench positioned in the non-display area, and the light emitting layer may extend to the non-display area and may be interposed into the trench.

The display panel according to embodiments of the disclosure may further comprise a low level gate voltage line disposed on the substrate and disposed in a second line area positioned inside the gate driving circuit area in the non-display area.

In the display panel according to embodiments of the disclosure, a high level gate voltage line may be disposed in the first line area where the plurality of gate clock lines are disposed.

The display panel according to embodiments of the disclosure may further comprise a capping layer on the cathode electrode, a first encapsulation layer disposed on the capping layer, and a second encapsulation layer covering the cathode electrode, the capping layer, the first encapsulation layer, and the load deviation compensation pattern.

The second encapsulation layer may overlap the plurality of gate clock lines and the gate driving circuit.

A display panel according to embodiments of the disclosure may comprise a substrate in which a display area and a non-display area are divided, a cathode electrode disposed in the display area and extending to the non-display area, a gate driving circuit disposed on the substrate and disposed in a gate driving circuit area within the non-display area, a plurality of gate clock lines disposed on the substrate, disposed in a first line area positioned outside the gate driving circuit area in the non-display area, and disposed not to overlap the cathode electrode, and an overcoat layer disposed on the plurality of gate clock lines and the gate driving circuit.

In the display panel according to embodiments, at least a portion of the cathode electrode may overlap the gate driving circuit.

The display panel according to embodiments of the disclosure may further comprise a low level gate voltage line disposed on the substrate and disposed in a second line area positioned inside the gate driving circuit area in the non-display area.

In the display panel according to embodiments of the disclosure, a high level gate voltage line may be disposed in the first line area.

The display panel according to embodiments of the disclosure may further comprise an anode electrode disposed in the display area and a light emitting layer disposed on the anode electrode. The anode electrode, the light emitting layer, and the cathode electrode may constitute a light emitting element of a subpixel in the display area.

The overcoat layer may include a trench positioned in the non-display area.

The light emitting layer may extend to the non-display area and be interposed into the trench.

The display panel according to embodiments of the disclosure may further comprise a capping layer on the cathode electrode, a first encapsulation layer disposed on the capping layer, and a second encapsulation layer covering the cathode electrode, the capping layer, and the first encapsulation layer. The second encapsulation layer may overlap the plurality of gate clock lines and the gate driving circuit.

A display panel according to embodiments of the disclosure may comprise a substrate having a display area and a non-display area, a cathode electrode disposed in the display area and in the non-display area, a gate driving circuit disposed on the substrate in a gate driving circuit area within the non-display area, a plurality of gate clock lines and a first level gate voltage line disposed on the substrate in a first line area positioned outside the gate driving circuit area in the non-display area, and disposed to not overlap the cathode electrode in the non-display area, a second level gate voltage line disposed on the substrate in a second line area positioned outside the gate driving circuit area in the non-display area, and located in position to be overlapped by the cathode electrode in the non-display area, a light emitting layer disposed in the non-display area and positioned between the cathode electrode and the second level gate voltage line in the second line area, and an overcoat layer disposed on the plurality of gate clock lines and the gate driving circuit.

In the display panel according to embodiments of the disclosure, the first level gate voltage line is a high level gate voltage line and the second level gate voltage line is a low level gate voltage line.

The display panel according to embodiments of the disclosure may further comprise a gate in panel array (the gate driving circuit) disposed in the non-display area and positioned under the overcoat layer.

The display panel according to embodiments of the disclosure may further comprise a first trench in the overcoat layer located over the gate in panel array and having the light emitting layer therein.

The display panel according to embodiments of the disclosure may further compris a second trench in the overcoat layer located over the second line area and having the light emitting layer therein.

According to embodiments of the disclosure described above, there may be provided a display panel that does not causing a screen abnormality although the gate driving circuit is embedded therein.

According to embodiments of the disclosure, there may be provided a display panel capable of normal operation of the gate driving circuit although the gate driving circuit is embedded therein.

According to embodiments of the disclosure, there may be provided a display panel capable of reducing a gate bezel related to embedding the gate driving circuit.

According to embodiments of the disclosure, there may be provided a display panel capable of reducing a load deviation between gate clock lines by disposing gate clock lines related to the operation of the gate driving circuit not to overlap the cathode electrodes.

According to embodiments of the disclosure, there may be provided a display panel capable of reducing a load deviation between gate clock lines by further disposing a load deviation compensation pattern overlapping gate clock lines.

According to the embodiments of the disclosure, there may be provided a display panel capable of reducing a scan signal output characteristic deviation in the gate driving circuit by reducing the load deviation between gate clock lines.

The above description has been presented to enable any person skilled in the art to make and use the technical idea of the disclosure, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the disclosure. The above description and the accompanying drawings provide an example of the technical idea of the disclosure for illustrative purposes only. That is, the disclosed embodiments are intended to illustrate the scope of the technical idea of the disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display panel, comprising:
a substrate having a display area and a non-display area;
a gate driving circuit disposed on the substrate in a gate driving circuit area within the non-display area;
a plurality of gate clock lines disposed on the substrate in a first line area positioned outside the gate driving circuit area in the non-display area;
an overcoat layer disposed on the plurality of gate clock lines and the gate driving circuit;
a cathode electrode disposed in the display area and in the non-display area; and a load deviation compensation pattern disposed in the non-display area and overlapping the plurality of gate clock lines,
wherein the load deviation compensation pattern is a first plate of a capacitor and the plurality of gate clock lines are second plate of the capacitor.

2. The display panel of claim 1, wherein the load deviation compensation pattern is positioned above the plurality of gate clock lines.

3. The display panel of claim 1, wherein the load deviation compensation pattern is connected to the cathode electrode.

4. The display panel of claim 1, wherein the cathode electrode contacts a side surface and an upper surface of one end of the load deviation compensation pattern.

5. The display panel of claim 1, wherein at least a portion of the load deviation compensation pattern overlaps at least a portion of the gate driving circuit.

6. The display panel of claim 1, wherein the cathode electrode is positioned on the overcoat layer, and
wherein at least a portion of the cathode electrode overlaps the gate driving circuit.

7. The display panel of claim 1, wherein at least one of the plurality of gate clock lines overlaps the cathode electrode.

8. The display panel of claim 1, further comprising:
an anode electrode disposed in the display area; and
a light emitting layer disposed on the anode electrode,
wherein the anode electrode, the light emitting layer, and the cathode electrode constitute a light emitting element of a subpixel in the display area, and
wherein the load deviation compensation pattern includes the same material as the anode electrode.

9. The display panel of claim 8, further comprising:
a trench in the overcoat layer, the trench being positioned in the non-display area, and
wherein the light emitting layer extends to the non-display area and includes a portion that is positioned within the trench.

10. The display panel of claim 1, further comprising a low level gate voltage line disposed on the substrate and disposed in a second line area positioned inside the gate driving circuit area in the non-display area.

11. The display panel of claim 1, wherein a high level gate voltage line is disposed in the first line area.

12. The display panel of claim 1, further comprising:
a capping layer on the cathode electrode;
a first encapsulation layer disposed on the capping layer; and
a second encapsulation layer covering the cathode electrode, the capping layer, the first encapsulation layer, and the load deviation compensation pattern,
wherein the second encapsulation layer overlaps the plurality of gate clock lines and the gate driving circuit.

13. The display panel of claim 1 where in the cathode electrode extends as a continuous, integrated member from the display area to the non-display area.

14. A display panel, comprising:
a substrate having a display area and a non-display area;
a cathode electrode disposed in the display area and in the non-display area;
a gate driving circuit disposed on the substrate in a gate driving circuit area within the non-display area;
a plurality of gate clock lines disposed on the substrate in a first line area positioned outside the gate driving circuit area in the non-display area, and disposed to not overlap the cathode electrode in the non-display area;
an overcoat layer disposed on the plurality of gate clock lines and the gate driving circuit; and
a gate in panel array disposed in the non-display area and positioned under the overcoat layer,
wherein the overcoat layer includes a trench allowing a light emitting layer to be disposed therein.

15. A display panel, comprising:
a substrate having a display area and a non-display area;
a cathode electrode disposed in the display area and in the non-display area;
a gate driving circuit disposed on the substrate in a gate driving circuit area within the non-display area;
a plurality of gate clock lines and a first level gate voltage line disposed on the substrate in a first line area positioned outside the gate driving circuit area in the non-display area, and disposed to not overlap the cathode electrode in the non-display area;
a second level gate voltage line disposed on the substrate in a second line area positioned outside the gate driving circuit area in the non-display area, and located in position to be overlapped by the cathode electrode in the non-display area;
a light emitting layer disposed in the non-display area and positioned between the cathode electrode and the second level gate voltage line in the second line area;
an overcoat layer disposed on the plurality of gate clock lines and the gate driving circuit; and
a first trench in the overcoat layer located over a gate in panel array and having the light emitting layer therein.

16. The display panel of claim 15, wherein the first level gate voltage line is a high level gate voltage line and the second level gate voltage line is a low level gate voltage line.

17. The display panel of claim 15 further including:
the gate in panel array disposed in the non-display area and positioned under the overcoat layer.

18. The display panel of claim 15 further including:
a second trench in the overcoat layer located over the second line area and having the light emitting layer therein.

* * * * *